bito et al.

(12) United States Patent
(10) Patent No.: US 8,110,652 B2
(45) Date of Patent: Feb. 7, 2012

(54) POLYIMIDE RESIN

(75) Inventors: Tsuyoshi Bito, Kanagawa (JP); Shuta Kihara, Kanagawa (JP); Jitsuo Oishi, Kanagawa (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 541 days.

(21) Appl. No.: 12/374,110

(22) PCT Filed: Jul. 17, 2007

(86) PCT No.: PCT/JP2007/064110
§ 371 (c)(1),
(2), (4) Date: Jan. 16, 2009

(87) PCT Pub. No.: WO2008/010494
PCT Pub. Date: Jan. 24, 2008

(65) Prior Publication Data
US 2009/0269597 A1 Oct. 29, 2009

(30) Foreign Application Priority Data
Jul. 18, 2006 (JP) ................................ 2006-196042

(51) Int. Cl.
C08G 73/10 (2006.01)
C09J 179/08 (2006.01)
B29C 41/12 (2006.01)
H05K 1/03 (2006.01)

(52) U.S. Cl. .......................... 528/353; 528/269; 428/458

(58) Field of Classification Search .................. 528/353, 528/269; 428/458
See application file for complete search history.

(56) References Cited

U.S. PATENT DOCUMENTS

| 3,639,343 | A | 2/1972 | Su et al. |
| 7,078,477 | B2 | 7/2006 | Oguro et al. |
| 7,217,462 | B2 | 5/2007 | Kihara et al. |
| 2004/0265609 | A1 | 12/2004 | Kihara et al. |
| 2004/0266979 | A1* | 12/2004 | Oguro et al. .................. 528/336 |

FOREIGN PATENT DOCUMENTS

| JP | 55-091895 | 7/1980 |
| JP | 07-166148 | 6/1995 |
| JP | 2000-169579 | 6/2000 |
| JP | 2000-319388 | 11/2000 |
| JP | 2001-329246 | 11/2001 |
| JP | 2003-155342 | 5/2003 |
| JP | 2003-168800 | 6/2003 |
| JP | 2007-080885 | 3/2007 |
| JP | 2007-137050 | 6/2007 |
| WO | WO 2006/077964 A2 | 7/2006 |

* cited by examiner

*Primary Examiner* — Kelechi Egwim
(74) *Attorney, Agent, or Firm* — Antonelli, Terry, Stout & Kraus, LLP.

(57) ABSTRACT

A polyimide resin which is soluble in an organic solvent and which has a low coefficient of water absorption, thermosetting properties, high heat resistance and excellent adhesive properties, a method for manufacturing the same, an adhesive and a film each containing the subject polyimide resin and a metal-clad laminate including an adhesive layer composed of the subject polyimide resin are provided.

The polyimide resin is a polyimide resin containing a repeating unit represented by the following formula (1) and a repeating unit represented by the following formula (2), with a proportion of a group presented by the following formula (3) being 50% by mole or more of the whole of X.

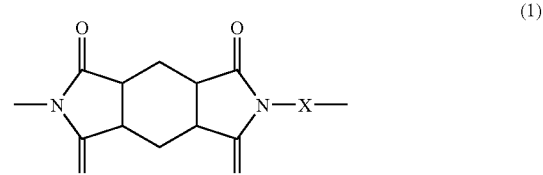

(1)

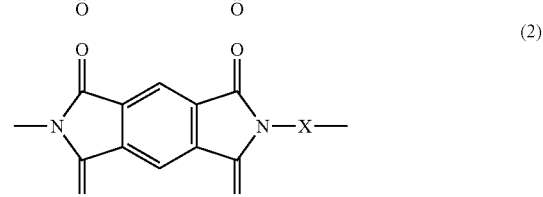

(2)

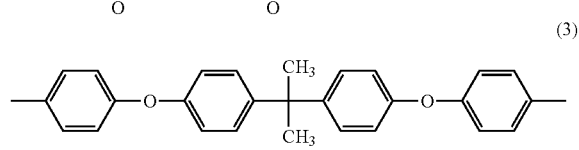

(3)

27 Claims, No Drawings

POLYIMIDE RESIN

TECHNICAL FIELD

The present invention relates to a polyimide resin which is soluble in an organic solvent and which exhibits thermosetting properties, low water absorption properties and high heat resistance, a film containing the subject polyimide resin, an adhesive composed of the subject polyimide resin and a metal-clad laminate using the subject adhesive. The subject metal-clad laminate is processed into a printed wiring board, a surface heating element, an electromagnetic shielding material, a flat cable, etc.

BACKGROUND TECHNOLOGY

Polyimides have excellent performances in heat resistance, mechanical physical properties, chemical resistance and the like so that they are widely used in an aerospace field, an electronic material field, etc. Most of them are an aromatic polyimide. Most of aromatic polyimides are insoluble in a solvent and non-thermoplastic and had a drawback in processability. Since a polyamic acid which is a precursor is soluble in an organic solvent, there is adopted a method in which a polyamic acid solution is formed in a desired shape and then imidated. But, the imidation is accompanied with desorption and evaporation of water. The temperature reaches even from 180 to 400° C. at the time of heat imidation and is far in excess of a boiling point of water. In the case of a thick film-shaped molded article, a fault regarding surface properties such as blister, etc. was easily generated. Hence, the selection of a condition at the time of molding, such as temperature setting, etc., involved a difficult aspect. Goods of a polyamic acid produced while omitting this imidation process cannot exhibit durability against heat, etc. inherent to a polyimide. Also, a polyamic acid solution is easily hydrolyzed in the presence of water, and therefore, a method for storing it included a drawback.

As one of methods for solving the foregoing problems, there is an organic solvent-soluble polyimide. As a matter of course, the organic solvent-soluble polyimide is able to be formed into a polyimide solution, and therefore, after forming into a desired shape, it can be processed only by volatilizing the organic solvent, whereby goods having good surface properties are easily obtainable. Also, it is excellent in storage stability.

As to this organic solvent-soluble polyimide, there have been made a number of studies, and they chiefly reply upon a devising of polymerization components. A method of introducing a benzophenone skeleton (see Patent Document 1) and the like are disclosed, and as one approach for this method, the introduction of an alicyclic structure is exemplified. For example, the use of isophoronediamine as a raw material is attempted (Patent Documents 2 and 3). However, in the polyimide resin obtained from isophoronediamine, goods with a high molecular weight are hardly obtainable, and in view of its skeleton, they are relatively rigid with respect to physical properties and brittle. There is a tendency that the coefficient of water absorption is high. On the other hand, there are disclosed polyimide resins containing a 1,2,4,5-cyclohexanetetracarboxylic acid skeleton (see Patent Documents 4, 5, 6 and 7). However, there are polyimide resins which have a 1,2,4,5-cyclohexanetetracarboxylic acid skeleton but which may not be said to have high solubility in an organic solvent as in those disclosed in Patent Documents 4 and 5. Patent Document 6 discloses a polyimide resin containing a 1,2,4,5-cyclohexanetetracarboxylic acid skeleton, which is ease to realize a high molecular weight and capable of easily producing a flexible film and which has sufficiently large solubility in an organic solvent. Also, Patent Document 7 discloses a method for manufacturing a solvent-soluble polyimide by polycondensation of an aliphatic tetracarboxylic dianhydride, an aliphatic tetracarboxylic acid or a derivative thereof and a diamine compound in a solvent.

However, most of the foregoing polyimide resins are those having a high coefficient of water absorption and involved problems such as the matter that they are inferior in hygroscopic dimensional stability in an application to a thin layer, etc.

In the light of the above, for the purpose of imparting solubility in an organic solvent while keeping performances which are characteristic features of a polyimide, such as heat resistance, mechanical physical properties, etc., a further devising is necessary in the kinds and proportions of a tetracarboxylic acid component and a diamine component, each of which is a polymerization component.

As an application example of an organic solvent-soluble polyimide, there is an adhesive for a metal-clad laminate. The metal-clad laminate includes one which is manufactured by bonding an insulating base material and a metal layer to each other via an adhesive or an adhesive film. For example, there is proposed a metal-clad laminate of a three-layer structure in which an insulating base material composed of an aromatic polyimide resin film and a metal layer are bonded to each other via an adhesive film (see Patent Document 8).

In a metal-clad laminate, there was encountered a problem that when the amount of a residual volatile component of an adhesive layer to be disposed between an insulating base material and a metal layer is high, blanching, blister, foaming, etc. of the adhesive layer is caused during a soldering step reaching a high temperature of 250° C. or higher, thereby noticeably hindering adhesive properties between the insulating base material and the metal layer (see Patent Document 9). Examples of this residual volatile component of the adhesive layer include water and the organic solvent which have not been removed in imidation and organic solvent removal steps during the formation of an adhesive layer or an adhesive film; water to be absorbed from the manufacturing environment; water to be absorbed at the time of dipping in an aqueous solution in an etching step; and the like. Of these, water is especially regarded as a problem. In order to solve the foregoing problem, it is desirable to decrease a coefficient of water absorption which is an index of the water content of a polyimide.

[Patent Document 1] JP-A-7-166148
[Patent Document 2] JP-A-2000-169579
[Patent Document 3] JP-A-2000-319388
[Patent Document 4] U.S. Pat. No. 3,639,343
[Patent Document 5] JP-A-2003-155342
[Patent Document 6] JP-A-2003-168800
[Patent Document 7] JP-A-2005-15629
[Patent Document 8] JP-A-55-91895
[Patent Document 9] JP-A-2001-329246

DISCLOSURE OF THE INVENTION

Problems that the Invention is to Solve

An object of the present invention is to solve the problems accompanied in both of the wholly aromatic polyimide resins and the alicyclic polyimide resins which have hitherto been used in an adhesive layer and to provide a polyimide resin which is soluble in an organic solvent and which exhibits a low coefficient of water absorption, thermoplastic properties, high heat resistance and excellent adhesive properties, a method for manufacturing the same, an adhesive and a film each containing the subject polyimide resin and a metal-clad laminate including an adhesive layer composed of the subject polyimide resin.

Means for Solving the Problems

Specifically, the present invention relates to:
(1) A polyimide resin containing a repeating unit represented by the following formula (1) and a repeating unit represented by the following formula (2):

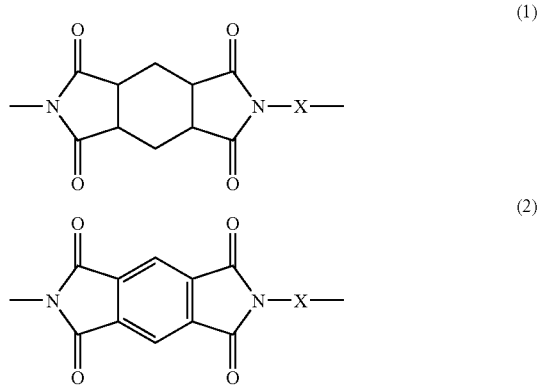

(in the formula (1) or (2), X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X; and X may have at least one kind of a functional group selected from the group consisting of a carboxyl group, a hydroxyl group and a carbonyl group), with a proportion of a group presented by the following formula (3):

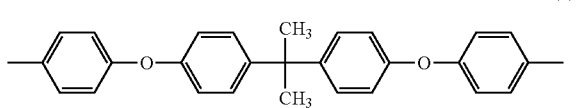

being 50% by mole or more (inclusive of 100% by mole) of the whole of X;
(2) A method for manufacturing a polyimide resin containing a repeating unit represented by the foregoing formula (1) and a repeating unit represented by the foregoing formula (2), which includes a step of reacting a tetracarboxylic acid component (Y) composed of at least one kind of a tetracarboxylic acid component (Y1) selected from the group consisting of 1,2,4,5-cyclohexanetetracarboxylic acid, 1,2,4,5-cyclohexanetetracarboxylic dianhydride and a reactive derivative of 1,2,4,5-cyclohexanetetracarboxylic acid and at least one kind of a tetracarboxylic acid component (Y2) selected from the group consisting of pyromellitic acid, pyromellitic dianhydride and a reactive derivative of pyromellitic acid; and a diamine component (Z) which is at least one kind selected from the group consisting of a diamine represented by NH$_2$X—NH$_2$ and a reactive derivative thereof, with a proportion of at least one kind (Z1) selected from the group consisting of 2,2-bis[4-(4-aminophenoxy)phenyl]propane and a reactive group thereof being 50% by mole or more (inclusive of 100% by mole) of the diamine component;
(3) A polyimide resin film comprising the polyimide resin as set forth above in (1);
(4) An adhesive containing the polyimide resin as set forth above in (1);
(5) A method for manufacturing the polyimide resin film as set forth in above in (3), which includes the steps of casting an organic solvent solution of the polyimide resin as set forth above in (1) or an organic solvent solution of the polyimide resin obtained by the manufacturing method as set forth above in (2) on a support and evaporating and removing the organic solvent; and
(6) A metal-clad laminate including an insulating base material, a metal layer and an adhesive layer disposed between the subject insulating base material and the metal layer, wherein the adhesive layer is formed of the polyimide resin as set forth above in (1) or the polyimide resin obtained by the manufacturing method as set forth above in (2).

ADVANTAGES OF THE INVENTION

The polyimide resin of the present invention is soluble in an organic solvent, low in coefficient of water absorption and satisfactory in thermoplastic properties and heat resistance and furthermore, excellent in adhesive properties. The metal-clad laminate obtained by using the polyimide resin of the present invention as an adhesive layer is excellent in adhesive properties and soldering heat resistance.

BEST MODES FOR CARRYING OUT THE INVENTION

The present invention is hereunder described in detail.
The polyimide resin of the present invention (hereinafter properly referred to as "polyimide A") contains a repeating unit represented by the following formula (1) and a repeating unit represented by the following formula (2):

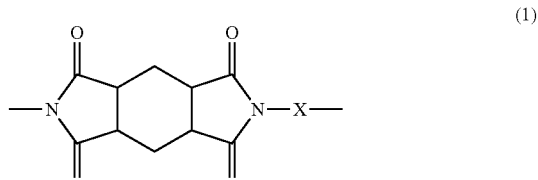

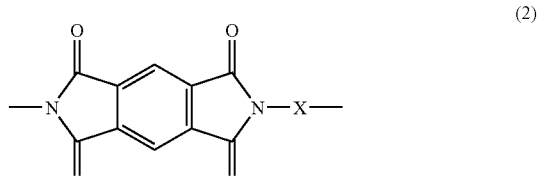

(in the formula (1) or (2), X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi (CH$_3$)$_2$— —C$_2$H$_4$O— and —S— may intervene in a main chain of X;

and X may have at least one kind of a functional group selected from the group consisting of a carboxyl group, a hydroxyl group and a carbonyl group), with a proportion of a group presented by the following formula (3):

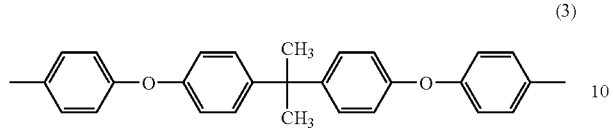
(3)

being 50% by mole or more, preferably 70% by mole or more, and more preferably 80% by mole or more (each inclusive of 100% by mole) of the whole of X. When the proportion of the group represented by the formula (3) is 50% by mole or more of the whole of X, it is possible to attain low water absorption properties. When the repeating unit represented by the formula (2) is coexistent in the repeating unit represented by the formula (1) capable of bringing solubility in an organic solvent in the molecule of the polyimide A, the coefficient of water absorption becomes lower.

A proportion of the repeating unit represented by the formula (2) in the polyimide A may be from 1 to 99% by mole, preferably from 5 to 95% by mole, more preferably from 10 to 90' by mole, and further preferably from 10 to 50% by mole. When the proportion of the formula (2) is 5% by mole or more, the heat resistance can be increased, and the coefficient of water absorption can be lowered; and when it is not more than 95% by mole, the solubility in an organic solvent is high.

When the proportion of the group represented by the formula (3) is less than 50% by mole of the whole of X, the coefficient of water absorption is high so that there is a possibility that the soldering heat resistance of a metal-clad laminated sheet using the subject polyimide resin as an adhesive layer is lowered. A molecular form of the polyimide A may be any of a block copolymer or a random copolymer.

In the polyimide A, from the standpoint of solubility in an organic solvent, a proportion of the repeating unit represented by the formula (1) to the repeating unit represented by the formula (2) (repeating unit represented by the formula (1)/ repeating unit represented by the formula (2)) is preferably from 1,900 to 5% by mole, more preferably from 900 to 11% by mole, and further preferably from 900 to 1000 by mole.

It is meant by the "solubility in an organic solvent" as referred to in the present invention that when a solute (polyimide) and an organic solvent are mixed and stirred, the mixture is of a homogenous phase somewhere in the temperature range of from 0° C. to a boiling point of the organic solvent at atmospheric pressure or 200° C., whichever is lower, by visual determination and that a value (solids content) expressed according to the following expression exceeds 5% by weight, preferably 7% by weight or more, and more preferably 10% by weight or more.

(Weight of solute)/[(Weight of organic solvent)+
(Weight of solute)]×100

A structure of the subject polyamic acid which is a precursor of the polyimide A is composed of a repeating unit represented by the following formula (4) and a repeating unit represented by the following formula (5).

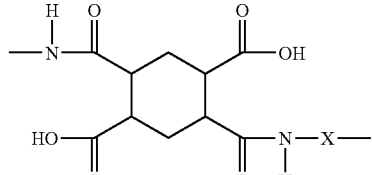
(4)

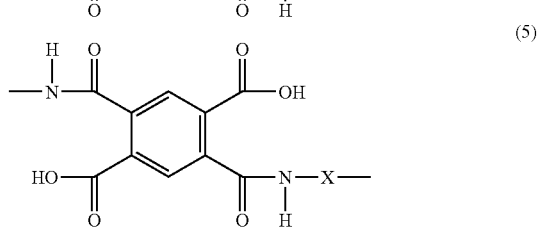
(5)

X is synonymous with that in the formulae (1) and (2).

In the formulae (1), (2), (4) and (5), X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; and at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X. Specific examples thereof include divalent aliphatic groups such as a polyalkylene group, a polyoxyalkylene group, a xylylene group and alkyl substitution products, halogen substitution products, carboxy substitution products and hydroxy substitution products thereof, etc.; divalent alicyclic groups derived from cyclohexane, dicyclohexylmethane, dimethylcyclohexane, isophorone, norbornane and alkyl substitution products, halogen substitution products, carboxy substitution products and hydroxy substitution products thereof, etc.; and divalent aromatic groups derived from benzene, naphthalene, biphenyl, diphenylmethane, diphenyl ether, diphenyl sulfone, benzophenone and alkyl substitution products, halogen substitution products, carboxy substitution products and hydroxy substitution products thereof, etc. Of these groups, in the present invention, a xylylene group; divalent alicyclic groups derived from isophorone and norbornane; and divalent aromatic groups derived from diphenyl ether, diphenyl sulfone and benzophenone are preferable from the standpoint of solubility in an organic solvent.

The polyimide A and the polyamic acid which is a precursor of the polyimide A are obtainable from a reaction of at least one kind of a tetracarboxylic acid component (Y) selected from a tetracarboxylic acid and a reactive derivative thereof and at least one kind of a diamine component (Z) selected from a diamine and a reactive derivative thereof. An end-capping component (W) which is at least one kind selected from a dicarboxylic anhydride and a monoamine may be reacted as the case may be. Any of the tetracarboxylic acid component (Y), the diamine component (Z) and the end-capping component (W) may include an isomer thereof.

As the tetracarboxylic acid component (Y), at least one kind selected from a tetracarboxylic acid, a tetracarboxylic dianhydride and a reactive derivative of a tetracarboxylic acid (for example, esters, etc.) is exemplified. The tetracarboxylic acid component (Y) is preferably composed of at least one kind of a tetracarboxylic acid component (Y1) selected from the group consisting of 1,2,4,5-cyclohexanetetracarboxylic acid, 1,2,4,5-cyclohexanetetracarboxylic dianhydride and a reactive derivative of 1,2,4,5-cyclohexanetetracarboxylic acid and at least one kind of a tetracarboxylic acid component (Y2) selected from the group consisting of pyromellitic acid, pyromellitic dianhydride and a reactive derivative of pyromellitic acid. From the standpoint of reactivity, the foregoing tetracarboxylic dianhydride is preferable. As to the tetracarboxylic dianhydride for forming each of the repeating units of the formulae (1) and (2), it is preferable to use 1,2,4,5-cyclohexanetetracarboxylic dianhydride (HPMDA) as the tetracarboxylic acid component (Y1) and pyromellitic dianhydride (PMDA) as the tetracarboxylic acid component (Y2), respectively.

In the present invention, other tetracarboxylic acid component than the foregoing tetracarboxylic acid component (Y) may be used as a raw material of the polyimide A and the polyamic acid which is a precursor of the polyimide A so far as it does not hinder performances of the polyimide A including solubility in an organic solvent, low coefficient of water absorption, thermoplastic properties, heat resistance, adhesive properties, etc. Examples of such a tetracarboxylic acid component include aromatic tetracarboxylic dianhydrides such as biphenyl-3,4,3',4'-tetracarboxylic dianhydride, biphenyl-2,3,3',4'-tetracarboxylic dianhydride, benzophenone-3,4,3',4'-tetracarboxylic dianhydride, diphenylsulfone-3,4,3',4'-tetracarboxylic dianhydride, 1,4,5,8-naphthalenetetracarboxylic dianhydride, hydroxydiphthalic dianhydride, 2,2-diphenylpropane-3,4,3',4'-tetracarboxylic dianhydride, 2,2-diphenylpropane-2,3,2',3'-tetracarboxylic dianhydride, 4,4-(m-phenylenedioxy)diphthalic dianhydride, etc.; and alicyclic tetracarboxylic dianhydrides such as cyclopentane-1,2,3,4-tetracarboxylic dianhydride, cyclobutane-1,2,3,4-tetracarboxylic dianhydride, etc. One or more kinds thereof can be used simultaneously, and it should not be construed that the present invention is limited thereto.

Though examples of the diamine component (Z) which is at least one kind selected from the group consisting of a diamine represented by $NH_2—X—NH_2$ and a reactive derivative thereof as a raw material of the polyimide A and the polyamic acid which is a precursor of the polyimide A include a diamine, a diisocyanate, a diaminodisilane and the like, a diamine is preferable from the standpoint of easiness of synthesis. As a diamine component (Z1) which is preferable for the formation of the repeating unit represented by the formulae (1), (2), (4) or (5), 2,2-bis[4-(4-aminophenoxy)phenyl]propane (BAPP) is exemplified. From the standpoint of achieving the low water absorption properties, the use amount of BAPP is preferably 50% by mole or more, more preferably 70% by mole or more, and further preferably 80% by mole or more (each inclusive of 100% by mole) of the whole of the diamine component.

A diamine component other than BAPP A is also useful as the raw material of the polyimide A and the polyamic acid which is a precursor of the polyimide A and may be any of an aromatic diamine, an aliphatic diamine, an alicyclic diamine, a diamine having a functional group other than an amino group in a molecule thereof, a reactive derivative of the foregoing diamine and a mixture thereof. The "aromatic diamine" as referred to in the present invention expresses a diamine in which an amino group is bonded directly on an aromatic ring and may contain an aliphatic group, an alicyclic group, an aromatic group or other substituent in a part of a structure thereof. The "aliphatic diamine" as referred to herein expresses a diamine in which an amino group is bonded directly on an aliphatic group and may contain an aliphatic group, an alicyclic group, an aromatic group or other substituent in a part of a structure thereof. The "alicyclic diamine" as referred to herein expresses a diamine in which an amino group is bonded directly on an alicyclic group and may contain an aliphatic group, an alicyclic group, an aromatic group or other substituent in a part of a structure thereof. For example, BAPP is an aromatic diamine because an amino group is bonded directly on an aromatic ring (benzene ring); and m-xylylenediamine (MXDA) is an aliphatic diamine because an amino group is bonded directly on an aliphatic group (methylene group).

Examples of the aliphatic diamine include ethylenediamine, hexamethylenediamine, polyethylene glycol bis(3-aminopropyl)ether, polypropylene glycol bis(3-aminopropyl)ether, 1,3-bis(aminomethyl)cyclohexane, 1,4-bis(aminomethyl)cyclohexane, p-xylylenediamine, m-xylylenediamine (MXDA), siloxanediamines, etc.

Examples of the alicyclic diamine include 4,4'-diaminodicyclohexylmethane, isophoronediamine, norbornanediamine, reactive derivatives thereof, etc.

Examples of the aromatic diamine include 1,4-phenylenediamine, 1,3-phenylenediamine, 4,4'-bis(4-aminophenoxy)biphenyl, 2,4-toluenediamine, 4,4'-diaminodiphenyl ether, 3,4'-diaminodiphenyl ether, 4,4'-diaminodiphenylmethane, 1,4-bis(4-aminophenoxy)benzene, 1,3-bis(4-aminophenoxy)benzene, 1,3-bis(3-aminophenoxy)benzene, α,α'-bis(4-aminophenyl)-1,4-diisopropylbenzene, α,α'-bis(3-aminophenyl)-1,4-diisopropylbenzene, 4,4'-diaminodiphenylsulfone, bis[4-(4-aminophenoxy)phenyl]sulfone, bis[4-(3-aminophenoxy)phenyl]sulfone, 2,6-diaminonaphthalene, 1,5-diaminonaphthalene, reactive derivatives thereof, etc.

Examples of the foregoing diamine having a functional group other than an amino group include 3,3'-dicarboxy-4,4'-diaminodiphenylmethane, 3,5-diaminobenzoic acid, 3,3'-dihydroxy-4,41-diaminobiphenyl, 2,4-diaminophenol, 4,4'-diaminobenzophenone, 3,3'-diaminobenzophenone, reactive derivatives thereof, etc.

When MXDA, 1,3-phenylenediamine, 4,4'-bis(4-aminophenoxy)biphenyl, 4,4'-diaminodiphenylmethane, 1,3-bis(3-aminophenoxy)benzene, bis[4-(4-aminophenoxy)phenyl]sulfone, 3,3'-dicarboxy-4,4'-diaminodiphenylmethane, 3,5-diaminobenzoic acid, 3,3'-dihydroxy-4,4'-diaminobiphenyl or 4,4'-diaminobenzophenone is selected among the foregoing diamines as the diamine component other than BAPP, the obtained polyimide A is more excellent in a balance among various properties including low water absorption properties, adhesive properties, heat resistance and the like as an adhesive layer of the metal-clad laminated sheet, and therefore, such is preferable.

A molecular end of the polyimide is an amino group, a carboxyl group or a carboxylic anhydride group. By reacting a compound having a dicarboxylic anhydride group or an amino group on such a molecular end (end-capping component (W)), it is possible to decrease the functional group on the molecular end, or to intentionally introduce a functional group such as an amino group, a carboxyl group, etc. or a substituent other than this into the molecular end. In order to lower the coefficient of water absorption of the polyimide resin, it is effective to introduce a substituent with low polarity into the molecular end of the subject polyimide. From the standpoint of soldering heat resistance of the obtained metal-clad laminated sheet, the coefficient of water absorption of the polyimide resin after curing, which is measured by a method as described later, is preferably not more than 2.5%, more preferably not more than 2.0%, and further preferably not more than 1.7 W. A minimum value of the coefficient of water absorption which can be industrially achieved is usually about 1%.

As the end-capping component (W) as a raw material of the polyimide A and the polyamic acid which is a precursor of the polyimide A, a dicarboxylic anhydride, a monoamine and the like are applicable. Examples of the dicarboxylic anhydride include phthalic anhydride, naphthlenedicarboxylic anhydride, biphenyldicarboxylic anhydride, 1,2,3,6-tetrahydrophthalic anhydride, 1,2-cyclohexanedicarboxylic anhydride, 5-norbornene-2,3-dicarboxylic anhydride (nasic anhydride, NAn), methyl-5-norbornene-2,3-dicarboxyluc anhydride, citraconic anhydride (CAn), maleic anhydride (MAn), 3-ethynylphthalic acid, 4-ethynylphthalic acid, 4-phenylethynylphthalic acid, etc.

Examples of the monoamine include aniline, aminonaphthalene, aminobiphenyl, 3-ethynylaniline, 4-ethynylaniline, etc. One or more kinds thereof can be used simultaneously, and it should not be construed that the present invention is limited thereto.

The polyimide A and the polyamic acid which is a precursor of the polyimide A are one obtainable through a step of reacting the tetracarboxylic acid component (Y) composed of 1,2,4,5-cyclohexanetetracarboxylic dianhydride and pyromellitic dianhydride and at least one kind of the diamine component (Z) represented by $NH_2$—X—$NH_2$ (X is the same as defined above) and containing 50% by mole or more (inclusive of 100% by mole) of 2,2-bis[4-(4-aminophenoxy)phenyl]propane and is manufactured by reacting the tetracarboxylic acid component (Y) in an amount of preferably from 0.66 to 1.5 moles, more preferably from 0.9 to 1.1 moles, and further preferably from 0.97 to 1.03 moles per mole of the diamine component (Z). Also, by regulating the molar ratio in the foregoing manner and further adding or not adding the end-capping component (W), it is possible to make the polyimide A and the polyamic acid have desired molecular weight and logarithmic viscosity. A logarithmic viscosity η of the polyimide A, which is measured at 30° C. using a 0.5 g/dL solution in N-methyl-2-pyrrolidone, is preferably from 0.15 to 2 dL/g. When the logarithmic viscosity η is 0.15 dL/g or more, in the case of forming the obtained polyimide into a metal-clad laminate, sufficient peel strength can be obtained. When the logarithmic viscosity η is not more than 2.0 dL/g, a viscosity of its solution (varnish) is appropriate, coating and handling are easy. The logarithmic viscosity η is preferably in the range of from 0.3 to 1.5 dL/g. Though a preferred logarithmic viscosity η of the subject polyamic acid is not particularly limited, it is usually from 0.1 to 1.0 dL/g.

For example, the polyimide A and the polyamic acid which is a precursor of the polyimide A having a logarithmic viscosity η falling within the foregoing range can be manufactured by regulating at least one condition including a use proportion of the tetracarboxylic acid component and the diamine component, the presence or absence of the end-capping agent and its use amount, reaction temperature and time, the amount of a catalyst and the like. The regulation of the foregoing condition can be achieved by carrying out a preliminary reaction, etc. For example, when the logarithmic viscosity η is regulated by the molar ratio of the tetracarboxylic acid component (Y) and the diamine component (Z) and reaction time, the closer to 1 the molar ratio, or the longer the reaction time, the larger the logarithmic viscosity η within the foregoing range. The farther from 1 the molar ratio within the range of from 0.66 to 1.5, or the shorter the reaction time, the smaller the logarithmic viscosity η within the foregoing range. What the amount of the end-capping agent (W) increases brings an effect equivalent to the matter that the molar ratio is far from 1. The polyimide A having a prescribed logarithmic viscosity η can be manufactured by previously obtaining the reaction time and other reaction conditions, etc. and the relationship with the logarithmic viscosity corresponding thereto and determining an end point of the reaction on the basis of this relationship.

Each of the polyimide A and the polyamic acid which is a precursor of the polyimide A can be manufactured as an organic solvent solution containing this and an organic solvent.

Though the organic solvent is not particularly limited, for example, N-methyl-2-pyrrolidone, N,N-dimethylacetamide, N,N-diethylacetamide, N,N-dimethylformamide, N,N-diethylformamide, N-methylcaprolactam, hexamethylphosphoramide, tetramethylene sulfone, dimethyl sulfoxide, m-cresol, phenol, p-chlorophenol, 2-chloro-4-hydroxytoluene, diglyme, triglyme, tetraglyme, dioxane, γ-butyrolactone, dioxolan, cyclohexanone, cyclopentanone, dichloromethane, chloroform, 1,2-dichloroethane, 1,1,2-trichloroethane, dibromomethane, tribromomethane, 1,2-dibromoethane, 1,1,2-tribromoethane and the like are useful; and two or more kinds of these organic solvents may be used in combination. However, taking into consideration the performance of a polyimide varnish composed of the polyimide A and the organic solvent, it is preferable to use N-methyl-2-pyrrolidone (NMP), N,N-dimethylacetamide (DMAC) or γ-butyrolactone (GBL) singly or in combination. The organic solvent is used in an amount such that the concentration of the polyimide A in the obtained organic solvent solution is preferably from 1 to 50% by weight, and more preferably from 5 to 400 by weight. Also, in the case of the manufacture by solution polymerization, a poor solvent, for example, hexane, heptane, benzene, toluene, xylene, chlorobenzene, o-dichlorobenzene, etc. can be used in combination with the foregoing organic solvent to an extent that a polymer is not deposited.

The polyimide A can be manufactured by (1) a solution polymerization method, (2) a method in which a solution of a polyamic acid which is a precursor is prepared and heated for imidation, (3) a chemical imidation method in which a solution of a polyamic acid which is a precursor is prepared and reacted with a dehydrating agent, (4) a method in which a salt such as a half ester salt of a tetracarboxylic dianhydride, etc. or an imide oligomer is obtained and subjected to solid phase polymerization, (5) a method in which a tetracarboxylic dianhydride and a diisocyanate are reacted, or other methods which have hitherto been publicly known. These methods may be employed in combination. The reaction of the tetracarboxylic acid component (Y) and the diamine component (Z) may be carried out in an organic solvent solution under heating in the presence of a catalyst which has hitherto been publicly known, such as acids, tertiary amines, anhydrides, etc.

As the catalyst to be used for manufacturing the polyimide A, a tertiary amine is preferable; specific examples thereof include trimethylamine, triethylamine (TEA), tripropylamine, tributylamine, triethanolamine, N,N-dimethylethanolamine, N,N-diethylethanolamine, triethylenediamine, N-methylpyrrolidine, N-ethylpyrrolidine, N-methylpiperidine, N-ethylpiperidine, imidazole, pyridine, quinoline, isoquinoline and the like; and at least one kind of a catalyst selected from these materials is used. From the standpoint of carrying out the reaction in a low amount of the catalyst for a period of time as short as possible, the use amount of the catalyst is preferably from 0.1 to 100% by mole, and more preferably from 1 to 10% by mole relative to the tetracarboxylic acid component (Y).

Of these methods, the following solution polymerization method (a) or (b) in which the organic solvent solution of the polyimide resin is directly obtainable or (c) a method in which the polyamic acid which is a precursor of the polyimide A is prepared and heated for imidation is preferable as the method for manufacturing the polyimide A.

Method (a):

(a1-1) A mixture containing the diamine component (Z), an organic solvent and optionally, a catalyst is stirred at from 10 to 600 rpm to form a uniform solution, which is then kept at a temperature of from 30 to 90° C., and the tetracarboxylic acid component (Y) and optionally, a catalyst are added.

(a1-2) A mixture containing the tetracarboxylic acid component (Y), an organic solvent and optionally, a catalyst is stirred at from 10 to 600 rpm to form a uniform solution, which is then kept at a temperature of from 30 to 90° C., and the diamine component (Z) and optionally, a catalyst are added.

(a2) After the method (a1-1) or (a1-2), the temperature is raised to 160 to 230° C., and preferably 180 to 205° C. over from 0.1 to 6 hours. This temperature is influenced by a boiling point of the organic solvent to be used. The temperature is kept substantially constant for from 0.5 to 24 hours, preferably from 1 to 12 hours, and more preferably from 1 to 6 hours while collecting the components to be removed outside the reaction system.

(a3) If desired, after cooling to from 10 to 205° C., the end-capping component (W) and optionally, an organic solvent and/or a catalyst are added, and the temperature is raised to 150 to 205° C., and preferably 160 to 200° C. The temperature is kept substantially constant for from 0.5 to 24 hours, and preferably from 1 to 6 hours while collecting the components to be removed outside the reaction system. Thereafter, if desired, an organic solvent is further added, and the mixture is cooled to an appropriate temperature.

Method (b):

(b1-1) A mixture containing the diamine component (Z), an organic solvent and optionally, a catalyst is stirred at from 10 to 600 rpm to form a uniform solution, which is then kept at a temperature of from 30 to 90° C., and the tetracarboxylic acid component (Y), optionally, the end-capping component (W) and optionally, a catalyst are added. Alternatively, (b1-2) A mixture containing the tetracarboxylic acid component (Y), optionally, the end-capping component (W), an organic solvent and optionally, a catalyst is stirred at from 10 to 600 rpm to form a uniform solution, which is then kept at a temperature of from 30 to 90° C., and the diamine component (Z) and optionally, a catalyst are added.

(b2) After the method (b1-1) or (b1-2), the temperature is raised to 160 to 230° C., and preferably 180 to 205° C. over from 0.1 to 6 hours. This temperature is influenced by a boiling point of the organic solvent to be used. The temperature is kept substantially constant for from 0.5 to 24 hours, and preferably from 2 to 12 hours while collecting the components to be removed outside the reaction system. Thereafter, if desired, an organic solvent is further added, and the mixture is cooled to an appropriate temperature.

Method (c):

(c1) A mixture containing a tetracarboxylic dianhydride as the tetracarboxylic acid component (Y), a diamine as the diamine component (Z), optionally, the end-capping component (W), the subject organic solvent and optionally, a catalyst is stirred at from 10 to 600 rpm to form a uniform solution, which is then kept at a temperature of from 0 to 90° C., and the subject temperature is kept for from 1 to 72 hours, thereby obtaining an organic solvent solution of a polyamic acid.

(c2) The organic solvent solution of a polyamic acid is formed in a desired shape, and chiefly in a thin film shape and regulated at from 120 to 400° C., and preferably from 180 to 400° C. over from 0.1 to 6 hours. The temperature may be raised in a stepwise manner and made to reach a target temperature. The temperature is kept substantially constant for from 0.1 to 24 hours, and preferably from 0.1 to 12 hours while collecting the components to be removed outside the reaction system. Thereafter, the mixture is cooled to an appropriate temperature.

The solution of the polyimide obtained in the method (a) or (b) may be used as it stands; or the polyimide A solution may be prepared through steps of adding a poor solvent to which the polyimide A has a low solubility or adding the polyimide A solution to a poor solvent to once deposit a solid of the polyimide A and further dissolving the solid in a separate organic solvent. By adding and dissolving the polyimide A obtained in the method (c) in a desired organic solvent as it stands, the polyimide A solution is obtainable.

A surfactant such as fluorine based or polysiloxane based surfactants, etc. may be added in the organic solvent solution of the polyimide A or the subject polyamic acid. According to this, it becomes easy to obtain an adhesive layer, a polyimide A film and the subject polyamic acid film, each of which has satisfactory surface smoothness.

The present invention also provides an adhesive containing the polyimide A.

The polyimide A film can be manufactured by coating (casting) the organic solvent solution of the polyimide A on a smooth support preferably provided with release properties, such as glass sheets, metal sheets, etc. and preferably heating at from 30 to 400° C. to evaporate and remove the organic solvent. The polyimide A film can be manufactured by evaporating the organic solvent at a temperature of from 30 to 120° C. to form a self-supporting film; peeling away the subject film from the support; fixing ends of the subject film; and drying the film at from a boiling point of the subject organic solvent to 400° C. The pressure of the drying atmosphere may be any of reduced pressure, atmospheric pressure or elevated pressure.

Also, the polyimide A film can be manufactured by coating (casting) the organic solvent solution of the polyamic acid which is a precursor of the polyimide A on a smooth support preferably provided with release properties, such as glass sheets, metal sheets, etc. and preferably heating at from 30 to 400° C. to achieve the evaporation and removal of the organic solvent and imidation. It is preferable to manufacture the polyimide A film by evaporating the organic solvent at a temperature of from 30 to 120° C. to form a self-supporting film; peeling away the subject film from the support; fixing ends of the subject film; and performing drying and imidation at from 180 to 400° C. The pressure of the drying atmosphere may be any of reduced pressure, atmospheric pressure or elevated pressure.

In the case of using it for an adhesive layer of a metal-clad laminate, a thickness of the polyimide A film is preferably from 1 to 200 am, and more preferably from 2 to 50 μm.

The metal-clad laminate of the present invention includes an insulating base material, a metal layer and an adhesive layer composed of the polyimide A to be disposed therebetween.

The metal-clad laminate can be manufactured by a method in which an organic solvent solution of the polyimide A is coated on one or both of an insulating base material and a metal layer, the organic solvent is evaporated and removed at from 30 to 400° C. to form an adhesive layer, and the insulating base material and the metal layer are then superimposed via the adhesive layer, followed by thermo-compression bonding; a method in which an organic solvent solution of a polyamic acid which is a precursor of the polyimide A is coated on one or both of an insulating base material and a metal layer, a part of the organic solvent is evaporated and removed at from 30 to 120° C. and then imidated at from 180 to 400° C. to form an adhesive layer, and the insulating base material and the metal layer are then superimposed via the adhesive layer, followed by thermo-compression bonding; or a method in which the polyimide A film obtained from the polyimide A solution or polyamic acid solution is disposed between an insulating base material and a metal layer, followed by thermo-compression bonding. Also, the metal-clad laminate in which an insulating base material and a metal layer are firmly bonded to each other can also be manufactured by a method in which a metal thin membrane is formed directly on one surface of a polyimide A film obtained from the polyimide A solution or polyamic acid solution by a method such as sputtering, vapor deposition, electroless plating, etc., and an insulating base material is placed on the other surface, followed by thermo-compression bonding; or a method in which an adhesive layer is formed on the surface of an insulating base material, and a metal thin membrane is formed on the surface of the subject adhesive layer by a method such as sputtering, vapor deposition, electroless plating, etc. From the standpoints of easiness of coating and adhesive force, a thickness of the adhesive layer is preferably from 1 to 100 μm, and more preferably from 2 to 50 μm.

The metal layer may also be formed of a metal foil obtainable by a method such as electrolysis, rolling, etc. As described previously, the metal layer may also be formed directly on the surface of the polyimide A film or the surface of the adhesive layer formed on the insulating base material. Though a thickness of the metal layer is not particularly limited, it is preferably in the range of from 1 to 100 μm from the standpoints of handling properties and strength. A material of the metal layer is preferably copper. Also, one surface (adhesive surface) or both surfaces of the metal foil may be subjected to a surface treatment such that a surface roughness Rz is from 0.1 to 12 μm. In the case of a metal layer which is generally called a low profile, such as a copper foil, etc., Rz is preferably from 0.1 to 4 μm, more preferably from 0.1 to 2 μm, further preferably from 0.4 to 2 μm, and still further preferably from 1.0 to 2 μm from the standpoints of realization of fine pitch and adhesive force. In the metal foil which has not been subjected to a surface treatment for bonding, in many occasions, its surface is generally treated with a preservative, etc., and therefore, it is preferable to use the metal foil after wiping the surface by a cloth having acetone or other organic solvent permeated thereinto or other method.

The insulating base material of the present invention is not particularly limited so far as it is able to electrically insulate the metal layer. Also, the insulating base material includes a flexible type and a rigid type, and all of these types are useful. Though a thickness of the insulating base material varies with the foregoing type, it is preferably from 3 to 2,000 μm. Examples of the insulating base material of a flexible type include films made of a polyimide resin (exclusive of the polyimide A), a polybenzimidazole, a polybenzoxazole, a polyamide (including aramid), a polyetherimide, a polyamide-imide, a polyester (including a liquid crystalline polyester), a polysulfone, a polyethersulfone, a polyetherketone, a polyetheretherketone, etc.; and of these, a polyimide resin (exclusive of the polyimide A) film is preferable from the standpoints of insulating properties and heat resistance. Specific examples thereof include trade names, "KAPTON EN", "KAPTON V" and "KAPTON H" (manufactured by Du Pont-Toray Co., Ltd.); trade names, "APICAL NPI" and "APICAL AH" (manufactured by Kaneka Corporation); a trade name, "UPILEX-S" (manufactured by Ube Industries, Ltd.); and the like. Though its thickness is not particularly limited, it is preferably from 3 to 150 μm, and more preferably from 7.5 to 75 μm.

Examples of the insulating base material of a rigid type include those obtained by forming an insulating coating on an insulating material sheet or a metal sheet such as a glass sheet, a ceramic sheet, a plastic sheet, etc.; and moldings obtained by impregnating and kneading a reinforcing material such as a glass fiber cloth, a plastic fiber cloth, a glass short fiber, etc. with a thermoplastic or thermosetting resin of every sort, such as a liquid crystal polymer, a phenol resin, an epoxy resin, etc. Though its thickness is not particularly limited, it is preferably from 30 to 2,000 μm.

As the method of thermo-compression bonding, in general, a method by a multi-daylight (vacuum) press, a continuous pressing method using a pressure roll, etc. and the like can be properly adopted.

A temperature of the thermo-compression bonding is preferably from 200 to 400° C., and more preferably from 250 to 350° C. A pressure of the thermo-compression bonding is preferably from 0.01 to 20 MPa, and more preferably from 0.1 to 10 MPa. Also, for the purpose of removing the organic solvent and air bubbles, it is preferable to achieve the thermo-compression bonding in a reduced pressure atmosphere.

When the metal layer of the metal-clad laminate of the present invention has a peel strength, as measured according to the peel strength measurement method of a copper foil by peeling at 90° in conformity with JIS C6471 as described later, of 0.5 N/mm or more, it can be put into practical use. The peel strength is preferably 0.8 N/mm or more.

EXAMPLES

The present invention is specifically described below with reference to the following Examples. However, it should be construed that the present invention is not limited thereto at all.

Measurement methods of physical properties are hereunder shown.

(1) IR Spectrum:

An IR spectrum was measured using JIR-WINSPEC 50, manufactured by JEOL Ltd.

(2) Logarithmic Viscosity η:

A solution of 0.5 g/dL of a polyimide in N-methyl-2-pyrrolidone was prepared. A liquid level drop time of this solution between marked lines was measured in a constant-temperature water bath at 30° C. by a Cannon-Fenske viscometer, and a logarithmic viscosity η was determined according to the following expression.

$$\eta\ (dL/g)=\ln[(\text{Drop time of solution})/(\text{Drop time of N-methyl-2-pyrrolidone})]/0.5$$

As to the logarithmic viscosity, its value closely resembles to an intrinsic viscosity and can be determined simply and easily.

(3) Glass Transition Temperature:

A glass transition temperature was determined by the DSC method. An intermediate point glass transition temperature Tmg obtained through measurement between 40 and 350° C. at a temperature rise rate of 10° C./min using DSC-50, manufactured by Shimadzu Corporation was defined as a glass transition temperature.

(4) Coefficient of Water Absorption of Polyimide:

A coefficient of water absorption of a polyimide was determined according to the method of IPC-TM-650 2.6.2.1.

After drying a polyimide film of 50.8 mm×50.8 mm at 120° C. for one hour, its weight ($W_0$) was measured. This film was dipped in distilled water at 23° C. for 24 hours, and after wiping off water on the surface, its weight ($W_1$) was rapidly measured.

$$\text{Coefficient of water absorption}(\%) = [(W_1 - W_0) \div W_0] \times 100$$

(5) Peel Strength of Metal Layer:

A peel strength of a metal layer was determined according to the peel strength measurement method of a copper foil by peeling at 90° in conformity with JIS C6471 (method A using a rotating drum type support fitting for peel strength measurement).

(6) Soldering Heat Resistance:

The following test was carried out while referring to JIS C6471.

A specimen of 10 mm×50 mm was cut out from a metal-clad laminate and allowed to stand in a constant-temperature chamber at a humidity of 500 and 23° C. for 24 hours. Subsequently, the specimen was floated on a soldering bath for 20 seconds. Separate specimens were used at a temperature of 260° C. and 280° C. The case where appearance abnormality such as blister, peeling, etc. is not caused was designated as "A"; and the case where appearance abnormality is caused was designated as "C".

(7) Solubility in an Organic Solvent:

In the foregoing methods, visual judgment and measurement of the solids content were carried out. As a result of the visual judgment of an organic solvent solution of the polyimide A having the solids content exceeding 5% by weight, one having a homogenous phase was defined as "good"; and one not having a homogenous phase such that components which are explicitly different from those in a solution, such as a deposit, a gel, etc. are precipitated or floated, was defined as "x".

Example 1

In a 300-mL five-necked glass-made round bottom flask which was provided with a Dean-Stark equipped with a stainless steel-made semicircular stirring blade, a nitrogen introducing tube and a cooling tube, a thermometer and a glass-made end cap, 27.46 g (0.06689 moles) of 2,2-bis[4-(4-aminophenoxy)phenyl]propane (BAPP, manufactured by Wakayama Seika Kogyo Co., Ltd.), 50.00 g of N-methyl-2-pyrrolidone (NMP, manufactured by Mitsubishi Chemical Corporation) and 0.34 g of triethylamine (TEA, manufactured by Kanto Chemical Co., Inc.) as a catalyst were stirred under a nitrogen atmosphere at 100 rpm, thereby obtaining a solution.

13.49 g (0.06020 moles) of 1,2,4,5-cyclohexanetetracarboxylic dianhydride (HPMDA, manufactured by Mitsubishi Gas Chemical Company, Inc.), 1.46 g (0.00669 moles) of pyromellitic dianhydride (PMDA, manufactured by Mitsubishi Gas Chemical Company, Inc.) and 13.62 g of NMP were collectively added thereto, respectively, and the mixture was then heated by a mantle heater, thereby raising the temperature within the reaction system to 200° C. over about 20 minutes. The temperature within the reaction system was kept at 200° C. for 5 hours while collecting a component to be distilled off.

After adding 96.38 g of N,N-dimethylacetamide (DMAC), the mixture was stirred at around 130° C. for about 30 minutes, thereby forming a uniform solution, which was then cooled to 100° C. over about 10 minutes. There was thus obtained a polyimide A solution having a solids content of 20% by weight. At that time, as a result of visual observation, the polyimide A solution was a solution of a homogenous phase, and the solubility in an organic solvent of the polyimide A as a solute was good.

The obtained polyimide A solution was coated on a smooth glass sheet on which an extremely small amount of a release agent had been sprayed by a coater and then heated on a hot plate at 100° C. for one hour, thereby forming a self-supporting film. The film which had been peeled away from the glass sheet was fixed in several places by clips onto a stainless steel-made frame and then allowed to stand in a vacuum dryer at 20° C. for 5 hours, thereby removing the organic solvent substantially completely (less than 1% by weight). There was thus obtained a film of the polyimide A. As a result of measuring an IR spectrum of this film of the polyimide A, characteristic absorption of an imide ring was observed at ν (C=O) of 1,776 and 1,706 (cm$^{-1}$). This polyimide A had a logarithmic viscosity of 1.09 dL/g, a glass transition temperature of 266° C. and a coefficient of water absorption of 1.4%.

A 25 μm-thick polyimide resin film (a trade name: KAPTON 100EN, manufactured by Du Pont-Toray Co., Ltd.) was used as an insulating base material; and the above-obtained polyimide A solution was coated on one surface thereof, heated on a hot plate at 100° C. for 0.5 hours and then dried in a vacuum dryer at 200° C. for 5 hours, thereby forming an adhesive layer having a thickness of 4 μm on the insulating base material. An 18 μm-thick electrolytic copper foil having been subjected to a surface roughing treatment for bonding and having Rz of 3.8 μm (a product name: 3EC-VLP, manufactured by Mitsui Mining & Smelting Co., Ltd.) was used as a metal layer, and the electrolytic copper foil was superimposed on the adhesive layer formed on the insulating base material via the roughed surface. This was sandwiched by stainless steel mirror finished sheets, put into hot plates of a heat press at a temperature of 330° C. and kept at a contact pressure (0 MPa) for 3 minutes, followed by thermo-compression bonding under a condition at 330° C. and 5 MPa for 5 minutes. Subsequently, the resultant was put between hot plates of a pressing machine at ordinary temperature and cooled under a condition at 5 MPa for 2 minutes, thereby obtaining a metal-clad laminate.

The peel strength of the metal layer of the obtained metal-clad laminate was 0.85 N/mm, and the solder heat resistance was rated as "A".

Example 2

In the same five-necked glass-made round bottom flask as that used in Example 1, 27.51 g (0.06702 moles) of BAPP, 50.00 g of NMP and 0.34 g of TEA as a catalyst were stirred under a nitrogen atmosphere at 100 rpm, thereby obtaining a solution.

10.52 g (0.04691 moles) of HPMDA, 4.39 g (0.02011 moles) of PMDA and 13.62 g of NMP were collectively added thereto, respectively, and the mixture was then heated by a mantle heater, thereby raising the temperature within the reaction system to 200° C. over about 20 minutes. The temperature within the reaction system was kept at 200° C. for 5 hours while collecting a component to be distilled off.

After adding 96.38 g of DMAC, the mixture was stirred at a temperature in the vicinity of 130° C. for about 30 minutes, thereby forming a uniform solution, which was then cooled to 100° C. over about 10 minutes. There was thus obtained a polyimide A solution having a solids content of 20% by weight. At that time, as a result of visual observation, the polyimide A solution was a solution of a homogenous phase, and the solubility in an organic solvent of the polyimide A as a solute was good.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,776 and 1,706 (cm$^{-1}$). This polyimide resin had a logarithmic viscosity of 0.96 dL/g, a glass transition temperature of 277° C. and a coefficient of water absorption of 1.2%.

A 25 μm-thick polyimide resin film (a trade name: KAPTON 100EN, manufactured by Du Pont-Toray Co., Ltd.) was used as an insulating base material; and the above-obtained polyimide A solution was coated on one surface thereof, heated on a hot plate at 100° C. for 0.5 hours and then dried in a vacuum dryer at 200° C. for 5 hours, thereby forming an adhesive layer having a thickness of 4 μm on the insulating base material. A 9 μm-thick electrolytic copper foil having been subjected to a surface roughing treatment for bonding and having Rz of 1.5 μm (a product name: F2-WS, manufactured by Furukawa Circuit Foil Co., Ltd.) was used as a metal layer, and the electrolytic copper foil was superimposed on the adhesive layer formed on the insulating base material via the roughed surface. This was sandwiched by stainless steel mirror finished sheets, put into hot plates of a heat press at a temperature of 330° C. and kept at a contact pressure (0 MPa) for 3 minutes, followed by thermo-compression bonding under a condition at 330° C. and 5 MPa for 5 minutes. Subsequently, the resultant was put between hot plates of a pressing machine at ordinary temperature and cooled under a condition at 5 MPa for 2 minutes, thereby obtaining a metal-clad laminate.

The peel strength of the metal layer of the obtained metal-clad laminate was 0.81 N/mm, and the solder heat resistance was rated as "A".

Example 3

In the same five-necked glass-made round bottom flask as that used in Example 1, 22.29 g (0.05429 moles) of BAPP, 3.17 g (0.02327 moles) of m-xylylenediamine (MXDA, manufactured by Mitsubishi Gas Chemical Company, Inc.) and 50.00 g of NMP were stirred under a nitrogen atmosphere at 100 rpm, thereby obtaining a solution.

15.65 g (0.06980 moles) of HPMDA, 1.69 g (0.00776 moles) of PMDA and 14.19 g of NMP were collectively added thereto, respectively, and the mixture was then heated by a mantle heater, thereby raising the temperature within the reaction system to 200° C. over about 20 minutes. The temperature within the reaction system was kept at 200° C. for 6 hours while collecting a component to be distilled off.

After adding 95.81 g of DMAC, the mixture was stirred at a temperature in the vicinity of 130° C. for about 30 minutes, thereby forming a uniform solution, which was then cooled to 100° C. over about 10 minutes. There was thus obtained a polyimide A solution having a solids content of 20% by weight. At that time, as a result of visual observation, the polyimide A solution was a solution of a homogenous phase, and the solubility in an organic solvent of the polyimide A as a solute was good.

A polyimide A film was obtained in the same manner as in Example 1, except for using the obtained polyimide A solution. As a result of measuring an IR spectrum of this polyimide A film, characteristic absorption of an imide ring was observed at ν (C=O) of 1,773 and 1,705 (cm$^{-1}$). This polyimide A had a logarithmic viscosity of 0.92 dL/g, a glass transition temperature of 239° C. and a coefficient of water absorption of 1.7%.

A metal-clad laminate was obtained in the same manner as in Example 1, except for using the obtained polyimide A solution. The peel strength of the metal layer of the obtained metal-clad laminate was 0.93 N/mm, and the solder heat resistance was rated as "A".

Comparative Example 1

In the same five-necked glass-made round bottom flask as that used in Example 1, 27.71 g (0.06750 moles) of BAPP, 50.00 g of NMP and 0.34 g of TEA as a catalyst were stirred under a nitrogen atmosphere at 100 rpm, thereby obtaining a solution.

14.72 g (0.06750 moles) of PMDA and 13.65 g of NMP were collectively added thereto, respectively, and the mixture was then heated by a mantle heater, thereby raising the temperature within the reaction system. After elapsing about 10 minutes, when the temperature reached 170° C., a solid was deposited within the reaction system, and the reaction solution became high in viscosity. While the temperature within the reaction system was raised to 200° C., the deposit did not disappear, the stirring became impossible because of high viscosity, and a polyimide resin solution of a homogenous phase could not be obtained.

Comparative Example 2

In the same five-necked glass-made round bottom flask as that used in Example 1, 22.50 g (0.1004 moles) of HPMDA, 31.42 g of NMP, 20.36 g of DMAC and 0.51 g of TEA as a catalyst were stirred under a nitrogen atmosphere at 100 rpm, thereby obtaining a solution.

In a 200-mL beaker, 21.12 g (0.1004 moles) of 4,4'-diaminodicyclohexylmethane (DCHM, manufactured by New Japan Chemical Co., Ltd.) which has been heated at about 80° C. was dissolved in 40.00 g of NMP, and the solution was transferred into a 200-mL dropping funnel together with 10.00 g of NMP. The glass-made end cap of the five-necked glass-made round bottom flask was taken away, the subject 200-mL dropping funnel was installed, and the mixture was dropped over about 2 hours. After completion of dropping, the internal temperature was regulated to 90° C. over 10 minutes, thereby keeping at 90° C. for 5 hours. Thereafter, the mixture was heated by a mantle heater, thereby raising the temperature within the reaction system to 180° C. over about 20 minutes. The temperature within the reaction system was kept at 180° C. for 2 hours while collecting a component to be distilled off.

After adding 58.23 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight. At that time, as a result of visual observation, the polyimide resin solution was a solution of a homogenous phase, and the solubility in an organic solvent of the polyimide resin as a solute was good.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,768 and 1,689 (cm$^{-1}$).

This polyimide resin had a logarithmic viscosity of 0.49 dL/g, a glass transition temperature of 281° C. and a coefficient of water absorption of 6.5%.

A metal-clad laminate was obtained in the same manner as in Example 1, except for using the obtained polyimide resin solution. The peel strength of the metal layer of the obtained metal-clad laminate was 0.68 N/mm, and the solder heat resistance was rated as "C".

Comparative Example 3

In the same five-necked glass-made round bottom flask as that used in Example 1, 27.43 g (0.06682 moles) of BAPP, 50.89 g of γ-butyrolactone (GBL, manufactured by Mitsubishi Chemical Corporation, Inc.) and 0.34 g of TEA as a catalyst were stirred under a nitrogen atmosphere at 100 rpm, thereby obtaining a solution.

14.979 g (0.06682 moles) of HPMDA and 12.72 g of DMAC were collectively added thereto, respectively, and the mixture was then heated by a mantle heater, thereby raising the temperature within the reaction system to 180° C. over about 20 minutes. The temperature within the reaction system was kept at 180° C. for 6 hours while collecting a component to be distilled off.

After adding 96.39 g of DMAC, the mixture was stirred at around 130° C. for about 30 minutes, thereby forming a uniform solution, which was then cooled to 100° C. over about 10 minutes. There was thus obtained a polyimide resin solution having a solids content of 20% by weight. At that time, as a result of visual observation, the polyimide resin solution was a solution of a homogenous phase, and the solubility in an organic solvent of the polyimide resin as a solute was good.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,774 and 1,706 (cm$^{-1}$). This polyimide resin had a logarithmic viscosity of 1.00 dL/g and a coefficient of water absorption of 1.6%.

A metal-clad laminate was obtained in the same manner as in Example 1, except for using the obtained polyimide resin solution. The peel strength of the metal layer of the obtained metal-clad laminate was 0.62 N/mm, and the solder heat resistance was rated as "A".

Comparative Example 4

In the same five-necked glass-made round bottom flask as that used in Example 1, 26.54 g (0.07203 moles) of 4,4'-bis(4-aminophenoxy)biphenyl (BAPB, manufactured by Wakayama Seika Kogyo Co., Ltd.), 50.00 g of NMP and 0.34 g of TEA as a catalyst were stirred under a nitrogen atmosphere at 100 rpm, thereby obtaining a solution.

12.92 g (0.05762 moles) of HPMDA, 3.14 g (0.01441 moles) of PMDA and 13.89 g of NMP were collectively added thereto, respectively, and the mixture was then heated by a mantle heater, thereby raising the temperature within the reaction system. After elapsing about 10 minutes, when the temperature reached 150° C., a yellowish white solid was deposited within the reaction system. While the temperature within the reaction system was raised to 200° C., the deposit did not disappear, and the reaction system was kept for 2 hours it was. However, since a homogenous phase was not formed, the system was cooled. A polyimide resin solution of a homogenous phase could not be obtained.

Comparative Example 5

In the same five-necked glass-made round bottom flask as that used in Example 1, 10.93 g (0.02662 moles) of BAPP, 12.44 g (0.06211 moles) of 4,4'-diaminodiphenyl ether (ODA, manufactured by Wakayama Seika Kogyo Co., Ltd.), 50.00 g of NMP and 0.41 g of TEA as a catalyst were stirred under a nitrogen atmosphere at 100 rpm, thereby obtaining a solution.

17.90 g (0.07985 moles) of HPMDA, 1.94 g (0.00887 moles) of PMDA and 14.80 g of NMP were collectively added thereto, respectively, and the mixture was then heated by a mantle heater, thereby raising the temperature within the reaction system to 180° C. over about 20 minutes. The temperature within the reaction system was kept at 180° C. for 5 hours while collecting a component to be distilled off.

After adding 95.20 g of DMAC, the mixture was stirred at around 13° C. for about 30 minutes, thereby forming a uniform solution, which was then cooled to 100° C. over about 10 minutes. There was thus obtained a polyimide resin solution having a solids content of 20% by weight. At that time, as a result of visual observation, the polyimide resin solution was a solution of a homogenous phase, and the solubility in an organic solvent of the polyimide resin as a solute was good.

A polyimide resin film was obtained in the same manner as in Example 1, except for using the obtained polyimide resin solution. As a result of measuring an IR spectrum of this polyimide resin film, characteristic absorption of an imide ring was observed at ν (C=O) of 1,776 and 1,707 (cm$^{-1}$). This polyimide resin had a logarithmic viscosity of 1.05 dL/g and a coefficient of water absorption of 3.5%.

A metal-clad laminate was obtained in the same manner as in Example 1, except for using the obtained polyimide resin solution. The peel strength of the metal layer of the obtained metal-clad laminate was 0.28 N/mm, and the solder heat resistance was rated as "C".

TABLE 1

| | Tetracarboxylic acid component | | Diamine component | | | Logarithmic viscosity η | Solubility in an organic solvent | Glass transition temperature (° C.) | Coefficient of water absorption (%) | Peel strength (N/mm) | Soldering heat resistance |
|---|---|---|---|---|---|---|---|---|---|---|---|
| | HPMDA (% by mole) | PMDA (% by mole) | BAPP (% by mole) | Name | (% by mole) | | | | | | |
| Example 1 | 90 | 10 | 100 | — | — | 1.09 | Good | 266 | 1.4 | 0.85 | A |
| Example 2 | 70 | 30 | 100 | — | — | 0.96 | Good | 277 | 1.2 | 0.81 | A |
| Example 3 | 90 | 10 | 70 | MXDA | 30 | 0.92 | Good | 239 | 1.7 | 0.93 | A |
| Comparative Example 1 | — | 100 | 100 | — | — | — | x | — | — | — | — |
| Comparative Example 2 | 100 | — | — | DCHM | 100 | 0.49 | Good | 281 | 6.5 | 0.68 | C |

TABLE 1-continued

|  | Tetracarboxylic acid component | | Diamine component | | | Logarithmic viscosity η | Solubility in an organic solvent | Glass transition temperature (°C.) | Coefficient of water absorption (%) | Peel strength (N/mm) | Soldering heat resistance |
|---|---|---|---|---|---|---|---|---|---|---|---|
|  | HPMDA (% by mole) | PMDA (% by mole) | BAPP (% by mole) | Name | (% by mole) | | | | | | |
| Comparative Example 3 | 100 | — | 100 | — | — | 1.00 | Good | 263 | 1.6 | 0.62 | A |
| Comparative Example 4 | 80 | 20 | — | BAPB | 100 | — | x | — | — | — | — |
| Comparative Example 5 | 90 | 10 | 30 | ODA | 70 | 1.05 | Good | 280 | 3.5 | 0.28 | C |

INDUSTRIAL APPLICABILITY

Since the polyimide resin of the present invention is soluble in an organic solvent and exhibits thermosetting properties, low water absorption properties, high heat resistance and excellent adhesive properties, it is favorably used for a polyimide resin film, an adhesive and a metal-clad laminate using the subject adhesive, and the subject metal-clad laminate is processed into a printed wiring board, a surface heating element, an electromagnetic shielding material, a flat cable, etc.

The invention claimed is:

1. A polyimide resin containing a repeating unit represented by the following formula (1) and a repeating unit represented by the following formula (2):

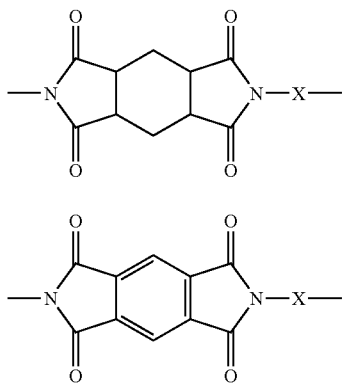

(in the formula (1) or (2), X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X; and X may have at least one kind of a functional group selected from the group consisting of a carboxyl group, a hydroxyl group and a carbonyl group), with a proportion of a group presented by the following formula (3):

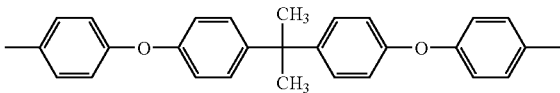

being 50% by mole or more (inclusive of 100% by mole) of the whole of X.

2. The polyimide resin according to claim 1, having a coefficient of water absorption of not more than 2.5%.

3. A polyimide resin solution containing the polyimide resin according to claim 1 and an organic solvent.

4. A method for manufacturing a polyimide resin containing a repeating unit represented by the following formula (1) and a repeating unit represented by the following formula (2):

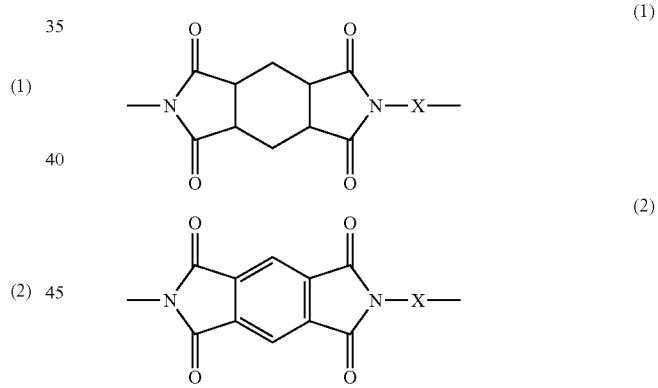

(in the formula (1) or (2), X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X; and X may have at least one kind of a functional group selected from the group consisting of a carboxyl group, a hydroxyl group and a carbonyl group), which includes a step of reacting a tetracarboxylic acid component (Y) composed of at least one kind of a tetracarboxylic acid component (Y1) selected from the group consisting of 1,2,4,5-cyclohexanetetracarboxylic acid, 1,2,4,5-cyclohexanetetracarboxylic dianhydride and a reactive derivative of 1,2,4,5-cyclohexanetetracarboxylic acid and at least one kind of a tetracarboxylic acid component (Y2) selected from the group consisting of pyromellitic acid, pyromellitic dianhydride and a reactive derivative of pyromellitic acid; and a diamine component (Z) which is at least one kind selected from the group consisting of a diamine represented by NH$_2$X—NH$_2$ and a reactive derivative thereof, with a proportion of at least one kind (Z1) selected from the group consisting of 2,2-bis[4-(4-aminophenoxy)phenyl]propane and a reactive group thereof being 50% by mole or more (inclusive of 100% by mole) of the diamine component.

5. The method for manufacturing a polyimide resin according to claim 4, wherein the reaction of the tetracarboxylic acid component (Y) and the diamine component (Z) is carried out upon heating in an organic solvent solution in the presence or absence of a catalyst, thereby obtaining a polyimide resin solution.

6. The method for manufacturing a polyimide resin according to claim 5, wherein the catalyst is a tertiary amine.

7. The method for manufacturing a polyimide resin according to claim 5, wherein the heating is carried out at a temperature of from 180 to 205° C. for from 1 to 12 hours.

8. A polyamic acid obtainable through a step of reacting a tetracarboxylic acid component (Y) composed of 1,2,4,5-cyclohexanetetracarboxylic dianhydride and pyromellitic dianhydride and at least one kind of the diamine component (Z) represented by NH$_2$—X—NH$_2$ (X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X; and X may have at least one kind of a functional group selected from the group consisting of a carboxyl group, a hydroxyl group and a carbonyl group) and containing 50% by mole or more (inclusive of 100% by mole) of 2,2-bis[4-(4-aminophenoxy)phenyl]propane.

9. A polyamic acid solution containing the polyamic acid according to claim 8 and an organic solvent.

10. A polyimide resin containing a repeating unit represented by the following formula (1) and a repeating unit represented by the following formula (2):

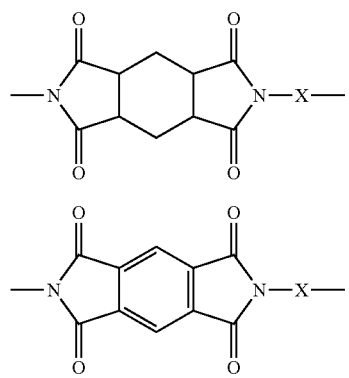

(in the formula (1) or (2), X represents a divalent aliphatic group having from 2 to 39 carbon atoms, a divalent alicyclic group having from 3 to 39 carbon atoms, a divalent aromatic group having from 6 to 39 carbon atoms or a divalent group composed of a combination thereof; at least one kind of a bonding group selected from the group consisting of —O—, —SO$_2$—, —CH$_2$—, —C(CH$_3$)$_2$—, —OSi(CH$_3$)$_2$—, —C$_2$H$_4$O— and —S— may intervene in a main chain of X; and X may have at least one kind of a functional group selected from the group consisting of a carboxyl group, a hydroxyl group and a carbonyl group), with a proportion of a group presented by the following formula (3):

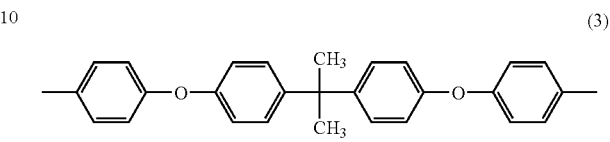

being 50% by mole or more (inclusive of 100% by mole) of the whole of X, obtainable by imidation of the polyamic acid according to claim 8 at from 180 to 400° C.

11. A polyimide resin film comprising the polyimide resin according to claim 1.

12. A method for manufacturing a polyimide resin film, which includes the steps of casting the polyimide resin solution according to claim 3 on a support and evaporating and removing the organic solvent.

13. A polyamic acid film comprising the polyamic acid according to claim 8.

14. An adhesive containing the polyimide resin according to claim 1.

15. A method for manufacturing a polyamic acid film including the steps of casting the polyamic acid solution according to claim 9 on a support and evaporating and removing the organic solvent.

16. A method for manufacturing a polyimide resin film including the steps of peeling away the polyamic acid film obtained by the manufacturing method according to claim 15 from the support, fixing ends of the film and regulating the temperature at from 180 to 400° C.

17. A metal-clad laminate including an insulating base material, a metal layer and an adhesive layer disposed between the insulating base material and the metal layer, wherein the adhesive layer is formed of the polyimide according to claim 1.

18. A metal-clad laminate including an insulating base material, a metal layer and an adhesive layer disposed between the insulating base material and the metal layer, wherein the adhesive layer is formed by coating the polyimide resin solution according to claim 3 on one or both of the insulating base material and the metal layer and subsequently evaporating and removing the organic solvent.

19. A metal-clad laminate including an insulating base material, a metal layer and an adhesive layer disposed between the insulating base material and the metal layer, wherein the adhesive layer is formed of the polyimide resin film according to claim 11.

20. A metal-clad laminate including an insulating base material, a metal layer and an adhesive layer disposed between the insulating base material and the metal layer, wherein the adhesive layer is formed by coating the polyamic acid solution according to claim 9 on one or both of the insulating base material and the metal layer, evaporating and removing a part of the organic solvent at a temperature of from 30 to 120° C. and then performing imidation at from 180 to 400° C.

21. The metal-clad laminate according to claim 17, wherein the surface of the metal layer opposing to the adhesive layer has a surface roughness Rz of from 0.1 to 4 μl.

22. The metal-clad laminate according to claim 17, wherein the metal layer has a peel strength, as measured according to the peel strength measurement method of a copper foil by peeling at 90° in conformity with JIS C6471, of 0.5 N/mm or more.

23. A method for manufacturing a polyimide resin film, which includes the steps of casting an organic polyimide resin solution of the polyimide resin obtained by the manufacturing method according to claim 4 on a support and evaporating and removing the organic solvent.

24. A metal-clad laminate including an insulating base material, a metal layer and an adhesive layer disposed between the insulating base material and the metal layer, wherein the adhesive layer is formed of the polyimide resin obtained by the manufacturing method according to claim 4.

25. A metal-clad laminate including an insulating base material, a metal layer and an adhesive layer disposed between the insulating base material and the metal layer, wherein the adhesive layer is formed by coating the polyimide resin solution obtained by the manufacturing method according to claim 5 on one or both of the insulating base material and the metal layer and subsequently evaporating and removing the organic solvent.

26. A metal-clad laminate including an insulating base material, a metal layer and an adhesive layer disposed between the insulating base material and the metal layer, wherein the adhesive layer is formed of the polyimide resin film obtained by the manufacturing method according to claim 12.

27. A metal-clad laminate including an insulating base material, a metal layer and an adhesive layer disposed between the insulating base material and the metal layer, wherein the adhesive layer is formed of the polyimide resin film obtained by the manufacturing method according to claim 16.

* * * * *